United States Patent
Hall-Goulle et al.

[11] Patent Number: 6,001,168
[45] Date of Patent: Dec. 14, 1999

[54] PIGMENT DISPERSIONS COMPRISING C.I. PIGMENT RED 222

[75] Inventors: Véronique Hall-Goulle, Reinach, Switzerland; Yves Grandidier, St. Louis, France; Hanspeter Hauser, Aesch, Switzerland

[73] Assignee: Ciba Specialty Chemicals Corporation, Tarrytown, N.Y.

[21] Appl. No.: 09/107,531

[22] Filed: Jun. 30, 1998

[30] Foreign Application Priority Data

Jun. 30, 1997 [CH] Switzerland ............... 1573/97
Dec. 16, 1997 [CH] Switzerland ............... 2896/97

[51] Int. Cl.$^6$ ..................... C08K 5/23
[52] U.S. Cl. .......... 106/496; 106/498; 106/499; 106/500; 106/501.1; 524/190
[58] Field of Search ............ 106/496, 493, 106/499, 500, 498, 501.1; 524/190; 534/860

[56] References Cited

U.S. PATENT DOCUMENTS

| | | | |
|---|---|---|---|
| 3,394,123 | 7/1968 | Ronco et al. | 260/203 |
| 4,597,794 | 7/1986 | Ohta et al. | 106/20 |
| 5,030,669 | 7/1991 | Hendrickson et al. | 523/333 |
| 5,085,698 | 2/1992 | Ma et al. | 106/20 |
| 5,106,417 | 4/1992 | Hauser et al. | 106/20 |
| 5,106,533 | 4/1992 | Hendrickson et al. | 252/314 |
| 5,415,964 | 2/1995 | Hayashi et al. | 430/106 |
| 5,702,860 | 12/1997 | Koyama et al. | 430/137 |

FOREIGN PATENT DOCUMENTS

| | | |
|---|---|---|
| 0654711 | 5/1995 | European Pat. Off. . |
| 0784085 | 7/1997 | European Pat. Off. . |
| 59-219756 | 12/1984 | Japan . |
| 96/14925 | 5/1996 | WIPO . |

OTHER PUBLICATIONS

K. Tsuda, Displays, vol. 14, No. 2, (1993), pp. 115–124 No month.

T. Sugiura, Journal of the SID, 1/3, (1993) pp. 341–346 No month.

H. Nemoto et al, IDW'95, CF–3, pp. 57–60 [No date].

Accession No. 97–399776 for JP 09176511 (Jul. 1997).
Accession No. 97–328594 for JP 09132740 (May 1997).
Accession No. 97–090690 for JP 08327811 (Dec. 1996).
Derwent Abstr. 85–023060 for 59219756 (Dec. 1984).

*Primary Examiner*—Anthony Green
*Attorney, Agent, or Firm*—David R. Crichton

[57] ABSTRACT

Pigment dispersions comprising
  a polymer,
  a compound of the formula (I)

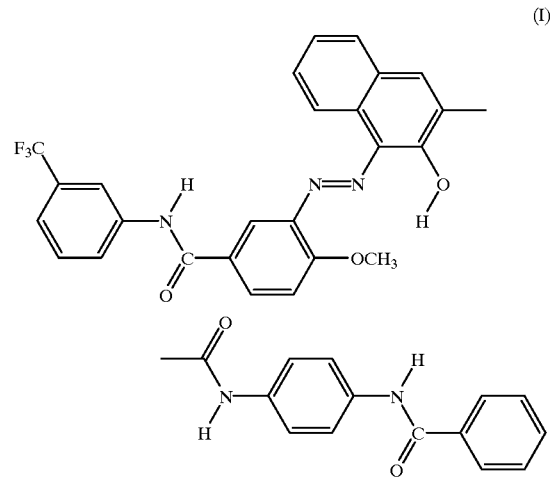

and
  a water-free solvent or
  a water-containing solvent, process for their preparation and also the use of (I) and the pigment dispersions of the invention.

7 Claims, No Drawings

PIGMENT DISPERSIONS COMPRISING C.I. PIGMENT RED 222

The present invention relates to pigment dispersions comprising a compound of the formula (I)

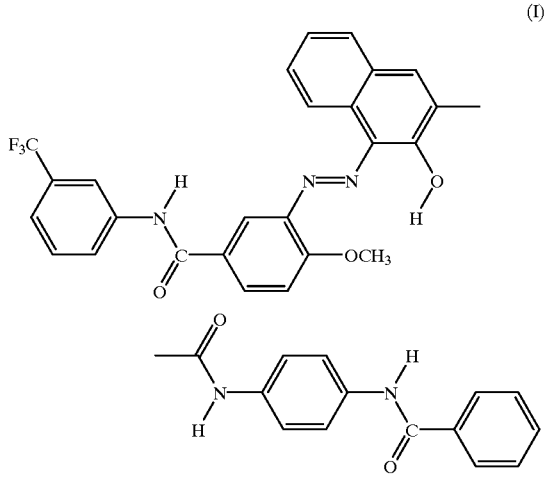

a process for their preparation and use, and the use of compound (I) for pigmenting high molecular mass material, such as for inks, toners, coating materials, color filters and cosmetics.

The compound of the formula (I) is known and has the Coulor Index, [sic] C.I. Pigment Red 222 and the chemical name N-[4-(benzoylamino)phenyl]-3-hydroxy-4-[[2-methoxy-5-[[[3-(trifluoromethyl)phenyl]carbonyl]amino]phenyl]azo]-2-naphthalenecarboxamide [sic].

Also known is the use of C.I. Pigment Red 222 in a composition with two other pigments, C.I. Pigment Red 149, C.I. Pigment Red 53:1, C.I. Pigment Red 48:1 or C.I. Pigment Red 177, for the preparation of a red toner for red inking pads and red pens, from JP-59,219,756.

Recent pigment applications are placing stringent requirements on coloristic and processing properties of the pigments. The pigments are required to possess clean, strong and bright hues which make it possible to open up a large color area. In addition, they should as far as possible be usable both as individual pigment and as an element for combination in, for example, trichromatic pigmentations. Of particular interest are bluish red pigments, especially pigments which possess a magenta shade and exhibit high transparency plus heat resistance.

In terms of application technique it is found advantageous to apply the pigment as a dispersion, since laborious mixing and grinding operations which represent an additional hygiene burden can be avoided. Moreover, dispersions provide better reproducibility of the pigmentation process, since in general the pigment particles are distributed more homogeneously than in the powder form. On economic grounds it is particularly desirable to employ concentrated, stable dispersions, which require little space during transportation or storage and at the same time possess good stability.

The object of the present invention was therefore to provide a pigment dispersion comprising a pigment having a magenta shade which meets the high applications and coloristic requirements, and a process for preparing this pigment dispersion. The object of the invention was also to provide a pigment having a magenta shade which can be used for the preparation of inks, toners, color filters or pigmented plastics.

The present invention relates accordingly to pigment dispersions comprising
(a1) a polymer,
(a2) a compound of the formula compound (I)

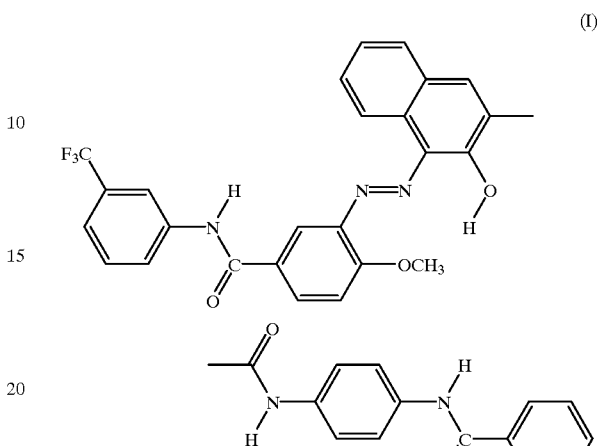

and
(a3) a water-free solvent or
(a4) a water-containing solvent.

The pigment dispersions prepared by the process of the invention preferably possess an average particle size distribution of 0.015–0.5 micrometers, with particular preference 0.03–0.3 micrometers and, with very particular preference, 0.05–0.2 micrometers. The particle size distribution was determined by the Joyce-Loebl disk centrifuging method.

The pigment content of the pigment dispersions of the invention preferably lies in the range from 0.01 to 10% by weight, preferably in the range from 0.1 to 5% by weight based on the overall weight of the dispersion.

In general the solvent is employed in from 50 to 99.99% by weight, preferably from 80 to 99.99% by weight, based on the overall weight of pigment and polymer.

The polymer content of the pigment dispersions of the invention lies judiciously in the range from 0.01 to 10% by weight, preferably in the range from 0.1 to 5% by weight based on the overall weight of the dispersion, the % data adding up to 100%.

In the present invention, solvent stands for water-containing solvents, which may include organic solvents, or water-free organic solvents, and/or solvent mixtures thereof.

Examples of suitable water-free organic solvents are polar aprotic solvents. Suitable examples are aliphatic $C_1$–$C_4$ alcohols, such as methanol, ethanol, n-propanol, isopropanol, n-butanol, tert-butanol, and also polyols, Cellosolves and carbitols, such as ethylene glycol, diethylene glycol, triethylene glycol, glycerol, propylene gylcol [sic], diacetone alcohols, such as 4-hydroxy4-methyl-2-pentanone, or ether alcohols, such as bis(2-hydroxyethyl) ether, bis(2-hydroxyproplyl) [sic] ether or bis(2-hydroxybutyl) ether, ethylene glycol monomethyl or monoethyl ether, propylene glycol methyl ether, dipropylene glycol methyl ether, tripropylene glycol methyl ether, ethylene glycol phenyl ether, propylene glycol phenyl ether, diethylene glycol monomethyl or monoethyl ether, diethylene glycol monobutyl ether, triethylene glycol monomethyl or monoethyl ether, and also ethers such as, for example, dioxane, dimethoxyethane or tetrahydrofuran, and also ketones, such as acetone, methyl ethyl ketone, 2-butanone, cyclohexanone, cyclopentanone, methyl isobutyl ketone or diacetone alcohol, for example, or chlorinated hydrocarbons, such as chloroform, trichloroethane, chlorobenzene, for example, and also N,N'-dimethylformamide or dimethyl sulfoxide or N-methyl-2-pyrrolidone, 2-pyrrolidone or N,N'-dimethylacetamide and mixtures thereof.

Water-containing solvents consist in general of water or mixtures of water and a water-free organic solvent.

In general, the pigment dispersions containing water-containing solvents are adjusted to a pH >7, with particular preference to a pH >8. The pH can be adjusted by mixing the water-containing mixture, comprising pigment, polymer and water, with a base, or by mixing with a water-containing solution comprising a base.

As bases it is possible to employ organic or inorganic bases.

As organic bases, use is made preferably of hydroxides of organic cations such as trimethyl- or triethylammonium, or amines, such as mono-, di- or trimethylamine, mono-, di- or triethylamine, or mono-, di- or tri-ethanolamine, mono-, di- or tri-propanolamine, N,N'-di- methylaminoethanol, N,N'-methylethanolamine and also morpholine, N-methylmorpholine, piperidine or pyrrolidine. Preferred inorganic bases employed are lithium, potassium or sodium hydroxide. Particular preference is given to dimethylaminoethanol or morpholine.

The pigment dispersions of the invention may comprise compound (I) in colloidal form, especially colloidally embedded in the polymer and/or solvent, and/or in dissolved form. The present invention therefore relates in addition to pigment dispersions comprising compound (I) in colloidal form.

The present invention preferably relates to a pigment dispersion comprising (b1) a polymer, (b2) a compound of the formula (I) and (b3) a water-containing solvent.

In a further preference, the present invention relates to water-containing pigment dispersions, by (g1) a polymer, (g2) a compound of the formula (I) and (g3) adjusting the pH to >7 by adding an aqueous solution comprising a base, especially an organic base.

The pigment dispersions of the invention are prepared in accordance with the process of the invention described below or can be prepared by conventional processes of the prior art as described in U.S. Pat. Nos. 4,597,794, 5,085,698, 5,030,669 or WO 96/14925, by grinding or comminution techniques from the corresponding pigments in the presence of polymers and solvent.

In the present invention, the term polymer embraces copolymer as well.

As polymer for water-containing pigment dispersions it is preferred to use a polymer consisting of a hydrophilic and hydrophobic portion. The former portion can be ionizable, and form salts, or can be non-ionizable.

The polymer is preferably a random, block or graft polymer.

The hydrophilic portion of the polymers is composed preferably, for example, of monomers which in addition to functional groups such as, for example, alcohol, carboxylic acid, carboxamide, carboxylic ester or sulfonic acid groups comprise sulfate, cyanate or carboxylic anhydride groups, or ether groups such as ethylene or propylene oxide groups and, in addition, a polymerizable vinyl or vinylene radical, such as an acrylic, or methylacrylic [sic], crotyl, sulfoethylmethylacrylic, sulfopropylmethylacrylic, vinylnaphthyl, vinylphenyl, vinyltolyl radical and also an itaconyl radical such as for example itaconyl monoester, maleic acid or a maleyl radical, such as, for example, maleic monoester, a fumaryl radical, such as, for example, fumaryl monoester and, in particular, vinylbenzoic acid. The monoesters are preferably monoesters of itaconyl, maleic or fumaric acid.

Preference is given to monomers possessing carboxyl groups, carboxylic anhydride groups, sulfonate groups or sulfate groups as functional groups. Particular preference is given to carboxyl or carboxylic anhydride groups, such as vinylbenzoic acid or maleic anhydride.

Monomers which form the hydrophobic portion of the polymers are preferably selected from the group of the apolar monomers consisting of styrene, styrene derivatives, such as $C_1-C_4$alkyl substituted styrene, and vinyl chloride, vinylnaphthalene, vinylnaphthalene derivatives, such as $C_1-C_4$alkyl substituted vinylnaphthalene, vinyltoluene, α, m, p or m, p vinyltoluene and aliphatic, $C_{12}-C_{18}$alkenes.

As hydrophobic apolar monomers it is preferred to use, for example, styrene, vinyltoluene and octadecene.

It is preferred to choose copolymers having a narrow molar mass distribution in the range of 1–2 Mw/Mn (in which Mw denotes mass average and Mn denotes number average).

The molar mass (number average) of the copolymers is preferably <100,000 g/mol.

Copolymers which consist, for example, of styrene, vinyltoluene and vinylbenzoic acid monomers preferably possess a molar mass of 10,000–30,000 g/mol, with particular preference 15,000–20,000 g/mol and, with very particular preference 10,000–15,000 g/mol.

A further preferred embodiment of the invention relates to copolymers which are prepared, for example, from styrene and maleic anhydride monomers, preferably possess a molar mass of 500–5000 g/mol, with particular preference 1000–3000 g/mol and, with very particular preference, 500–1500 g/mol.

For water-free pigment dispersions it is common to use acrylate, methacrylate, styrene and vinyl polymers.

Another particularly preferred embodiment of the invention relates to pigment dispersions comprising ethanol, polyvinyl butyrate and, for dispersions of methyl ethyl ketone as solvent, methyl methacrylate or, for pigment dispersion with chloroform as solvent, copolymers of methyl methacrylate and butyl acrylate.

Preferred polymers for water-containing pigment dispersion can be obtained, for example, from carboxyl-containing polymers together such as for example styrene, vinyltoluene and vinylbenzoic acid or vinylbenzoic acid and apolar monomers and from styrene and maleic anhydride or from copolymers of long-chain alkenes ($C_{12}-C_{18}$) with maleic anhydride, such as styrene-maleic anhydride, styrene-vinyltoluene-vinylbenzoic acid or octadecene-maleic anhydride.

A preferred embodiment of the process of the invention relates to the preparation of water-containing basic pigment dispersions of the compound (I) with a solution of a copolymer comprising vinylbenzoic acid and a non-polar monomer or with a solution comprising a carboxyl-containing polymer.

The polymers for water-containing or water-free pigment dispersions are commercially available, such as at the company Scientific Polymer Products Inc., or can be prepared by known methods, such for example as described in U.S. Pat.

Nos. 4,597,764 or 4,508,880, or such as indicated, for example, for the preparation of carboxyl-containing copolymers by free-radical addition polymerization of the monomers in the presence of a free-radical initiator such as 4,4'-azobis(4-cyanopentanoic acid), for example, and a radical transfer agent, such as dodecyl mercaptan, for example.

The monomers and polymerization or copolymerization auxiliaries, such as free-radical initiators or radical transfer agents and also solvents, are commercial products and are obtainable, for example, from the company Fluka.

If desired, the pigment dispersion of the invention may additionally comprise additives as well, such as surface-active compounds which possess a preferred spatial orientation in solvents. The additives and surface-active compounds of aqueous pigment dispersions are, for example, large molecules consisting of a hydrophilic head and a hydrophobic tail, such as Fluorad FC-170, a nonionic fluorine-containing surfactant, from 3M Inc. (or such as OLOA™1200 from Chevron Corp., Richfield, Calif., Amoco™9250, from Amoco Chemical Co., Naperville, Ill.). The pigment dispersions obtained possess preferably $\leq 20\%$ by weight, with particular preference $\leq 10\%$ by weight and, with very particular preference, $\leq 5\%$ by weight of additives based on the overall weight of the pigment dispersion and can if desired contain further cosolvents as well, such as cyclohexanone, cyclopentanone, N,N'-dimethylformamide or dimethyl sulfoxide.

The present invention additionally relates to a process for preparing the pigment dispersions of the invention, wherein (c1) the compound (I), a salt, a solvent and polymers are mixed with one another, and (c2) the mixture is then ground.

In general the dispersions of the invention are prepared by successive or simultaneous addition of the four starting materials, the compound (I), a salt, a polymer and solvent, the sequence of addition generally being unimportant. Preferably, however, the polymer is introduced as initial charge in the solvent and the pigment and salt are added, in the presence of a solvent if desired.

In a preferred embodiment of the process of the invention it is also possible first to prepare a mixture of the compound (I), a salt and a solvent and then to add the polymer.

With particular preference, the polymer is not added until before grinding.

As salt it is common to employ an alkali metal halide or ammonium halide, such as sodium, potassium, lithium or ammonium chloride or sodium, potassium, lithium or ammonium bromide.

The molar ratio of compound (I) to the salt lies usually in the range from 1:10 to 10:1, with particular preference in the range from 8:3 to 3:8.

The molar ratio of solvent to compound (I) and salt lies preferably in the range from 1:50 to 50:1, with particular preference in the range from 1:20 to 20:1.

The molar ratio of polymer to compound (I), solvent and salt lies judiciously in the range from 1:50 to 50:1, with particular preference in the range from 1:20 to 20:1.

In general, the addition of the starting compounds takes place by mixing in analogy to known methods of mixing, such as by stirring with stirring apparatus, kneading in kneaders or extruding. Kneaders are preferred.

The duration of mixing is generally dependent on the desired batch size, on the starting materials used (solvent, salt, polymer) and in general lies within the range from 5 to 20 hours. In the course of mixing it is usual to operate within a temperature range from 20 to 100° C., preferably in the temperature range from 40 to 80° C.

In the process of the invention the milling of the mixture comprising compound (I), polymer, salt and solvent takes place generally in known mixing apparatus, such as in ball mills or bead mills. When milling in ball mills it is preferred to add balls such as, for example, glass balls having a diameter in the range from 1 to 5 mm or when milling in bead mills to add zirconium oxide beads having a diameter in the range from 1 to 1.6 mm.

The milling process generally lasts, depending on the batch size, for from 5 to 30 hours in a ball mill and preferably from 15 to 25 hours. In a bead mill, the milling process can last, for example, for from 1 minute to 1 hour and, preferably, for from 5 to 30 minutes.

In a preferred embodiment of the process of the invention a pigment dispersion is prepared by (d1) mixing the compound (I), a salt and a solvent, and (d2) subsequently providing the mixture with polymers, and (d3) then grinding the resulting mixture.

A particularly preferred embodiment of the process of the invention relates to the preparation of a pigment dispersion by (e1) mixing the compound (I), a salt, a solvent, and (e2) then filtering the mixture and (e3) subsequently providing the filter residue with polymers and solvent and (e4) then grinding the resulting mixture.

In the particularly preferred embodiment of the process of the invention the starting compounds (compound (I), salt and solvent) are mixed by the method described above and in the abovementioned molar ratios. The resulting mixture is usually filtered and subsequently washed with water preferably until the content of salt or solvent is below a desired limit.

For filtration it is possible to employ generally known apparatus and methods of separating solid/liquid mixtures, such as centrifuges or filters, especially filter presses or Büchner funnels.

Following filtration, the filter residue is usually provided with a polymer and solvent and then ground as described above.

The molar ratio of the compound (I) of the filter residue to the polymer lies in general within the range from 20:1 to 1:20 and, preferably, in the range from 10:1 to 1:10.

The molar ratio of the compound (I) of the filter residue to the solvent lies in general within the range from 50:1 to 1:50, with particular preference in the range from 20:1 to 1:20 and, with very particular preference, in the range from 1:5 to 5:1.

A further particularly preferred embodiment of the process of the invention relates to the preparation of a pigment dispersion wherein (f1) the compound (I), a salt, a solvent are mixed, and (f2) the mixture is then filtered and (f3) subsequently the filter residue is dried and (f5) subsequently the dried filter residue is provided with polymers and solvent and (f6) the resulting mixture is then ground.

In a further particular preference of the process of the invention it is possible to dry the filter residue in the temperature range from 40 to 120° C., preferably in the range from 50 to 100° C. Examples of suitable drying apparatus are drying cabinets or paddle driers.

After drying, the dried filter residue is normally provided with a polymer and solvent and this resulting mixture is thereafter ground as described above.

The molar ratio of the compound (I) of the mixture comprising compound (I), solvent and polymer to the polymer lies in general within the range from 20:1 to 1:20 and, preferably, in the range from 10:1 to 1:10.

The molar ratio of the compound (I) of the mixture comprising compound (I), solvent and polymer of the filter residue to the solvent lies in general in the range from 1:50 to 50:1 and, with particular preference, in the range from 20:1 to 1:20 and, preferably, in the range and, with very particular preference, in the range from 1:5 to 5:1 [sic].

In a further particularly preferred embodiment of the processes of the invention a water-containing pigment dispersion is prepared by [lacuna] a water-containing solvent, comprising a base, especially an organic base, by adding the base [lacuna] the pH to ≧7, with particular preference to a pH of ≧8.

Depending on the field of use it may be of advantage if the organic solvent is removed from the water-containing pigment dispersion of the invention. In general, solvent removal takes place by distillation, preferably under reduced pressure.

After grinding, a pigment dispersion is usually obtained which can if desired be freed further by sieving or decantation from any particles which may settle out.

A further subject of the present invention are also the pigment dispersions obtainable by the process of the invention.

The present invention also relates to the use of compound (I) for preparing the pigment dispersions of the invention.

In addition, the present invention relates to compositions comprising high molecular mass material, especially high molecular mass organic material, and a coloristically effective amount of the pigment dispersions of the invention or of the compound (I).

Based on the composition of the invention the pigment dispersion of the invention or compound (I) is preferably employed in an amount of from 0.001 to 75% by weight, preferably from 0.01 to 50% by weight, based on the weight of the composition.

The present invention relates, furthermore, to the use of the compositions and pigment dispersions of the invention and of compound (I) for dyeing and pigmenting high molecular mass material, which may be organic or inorganic, and may denote plastics and/or natural substances. It may, for example, comprise natural resins or dry [sic] oils, rubber or casein, or modified natural substances such as chlorinated rubber, oil-modified alkyd resins, viscose, cellulose ethers or cellulose esters, such as ethylcellulose, cellulose acetate, propionate or butyrate, celulose actobutyrate [sic] and also nitrocellulose, but may in particular comprise fully synthetic organic polymers (thermosets and thermoplastics) as may be obtained by polymerization, for example by polycondensation or polyaddition. To the class of the polymers there belong, for example, polyolefins such as polyethylene, polypropylene, polyisobutylene, also substituted polyolefins such as addition polymers of monomers such as vinyl chloride, vinyl acetate, styrene, acrylonitrile, acrylates, methacrylates, fluoropolymers such as for [lacuna] polyfluoroethylene, polytrifluorochloroethylene or tetrafluoroethylene/hexafluoropropylene copolymer, and also copolymers of the abovementioned monomers, especially ABS (acrylonitrilelbutadiene/styrene) or EVA (ethylene/vinyl acetate). From the series of the polyaddition resins and polycondensation resins it is possible, for example, to use condensation products of formaldehyde with phenols, the so-called phenoplasts, and condensation products of formaldehyde and urea or thiourea, and also melamine, the so-called aminoplasts, and also the polyesters used as coating resins, either saturated, such as alkyd resins, and also unsaturated, such as maleic resins, and also linear polyesters, polyamides, polyurethanes, polycarbonates, polyphenylene oxides or silicones, silicone resins.

The high molecular mass compounds mentioned can be present individually or in mixtures as plastic masses, melts or in the form of spinning solutions.

The present invention therefore relates preferably to the use of the compositions and pigment dispersions of the invention and of compound (I) for the preparation of inks, for printing inks in printing processes, for flexographic printing, screen printing, packaging printing, security ink printing, intaglio printing or offset printing, for pre-press stages and for textile printing, for office, home applications or graphics applications, such as for paper goods, for example, for ballpoint pens, felt tips, fiber tips, card, wood, (wood) stains, metal, inking pads or inks for impact printing processes (with impact-pressure ink ribbons), for the preparation of colorants, for coating materials, for industrial or commercial use, for textile decoration and industrial marking, for roller coatings or powder coatings or for automotive finishes, for high-solids (low-solvent), water-containing or metallic coating materials or for pigmented formulations for aqueous paints, for the preparation of pigmented plastics for coatings, fibers, platters or mold carriers, for the preparation of non-impact-printing material for digital printing, for the thermal wax transfer printing process, the inkjet printing process or for the thermal transfer printing process, and also for the preparation of color filters, especially for visible light in the range from 400 to 700 nm, for liquid-crystal displays (LCDs) or charge combined [sic] devices (CCDs) or for the preparation of cosmetics or for the preparation of polymeric ink particles, toners, dry copy toners liquid copy toners, or electrophotographic toners.

For the pigmentation of the high molecular mass, preferably organic substances with the compounds obtained in accordance with the invention takes place [sic], for example, such that the compound of the invention, optionally in the form of masterbatches, is mixed with the high molecular mass materials using roll mills, mixing apparatus or grinding apparatus. The pigmented material is subsequently brought into the desired final form by conventional processes, such as calendering, compression molding, extrusion, spreading, casting or injection molding. In order to prepare non-rigid moldings or to reduce their brittleness it is often desired to incorporate so-called plasticizers into the high molecular mass organic compounds prior to forming. Examples of compounds which can be used as such plasticizers are esters of phosphoric acid, phthalic acid or sebacic acid. The plasticizers can be added before or after the incorporation of the compounds obtained in accordance with the invention into the polymers. It is also possible, in order to achieve different hues, to add fillers or other coloring constituents such as white, color or black pigments in desired amounts to the high molecular mass organic substances in addition to the compounds obtained in accordance with the invention.

For pigmenting lacquers, coating materials and printing inks the high molecular mass organic materials and the pigment dispersions obtained in accordance with the invention or compound (I), alone or together with additives, such as fillers, other pigments, siccatives or plasticizers, are generally dissolved or dispersed in a common organic solvent or solvent mixture. In this case it is possible to adopt a procedure whereby the individual components are dispersed or dissolved individually or else two or more are dispersed or dissolved together and only then are all of the components combined.

The present invention therefore also relates to a process for preparing the compositions of the invention by adding a coloristically effective amount of the pigment dispersions of the invention or compound (I) to high molecular mass material.

The present invention additionally relates to inks comprising a coloristically effective amount of the pigment dispersion of the invention or of compound (I) or of the composition of the invention.

Processes for producing inks especially for inkjet printing are generally known and are described for example in U.S. Pat. No. 5,106,412.

The inks can be prepared, for example, by mixing the pigment dispersions of the invention with polymeric dispersants.

The mixing of the pigment dispersions with the polymeric dispersant takes place preferably in accordance with generally known methods of mixing, such as stirring or mechanical mixing; it is preferably advisable to use intensive mechanical mixers such as Ultraturax [sic].

When mixing compound (I) with polymeric dispersants it is judicious to use a water-dilutable organic solvent.

The weight ratio of the pigment dispersion to the ink is judiciously chosen [lacuna] range from 0.001 to 75% by weight, preferably from 0.01 to 50% by weight, based on the overall weight of the ink.

Examples of suitable polymeric dispersants are carboxyl-containing polyacrylic resins such as polymeric methacrylic or crotonic acids, especially those obtained by addition polymerization of acrylic acid or acrylic acid and other acrylic monomers such as acrylates.

Depending on the field of use or when using compound (I) it is also possible if desired to admix a small proportion of a water-miscible organic solvent in from 0.01 to 30% by weight, based on the overall weight of the ink, and/or to admix water and/or bases so as to give a pH in the range from 7 to 11. It may likewise be advantageous to add preservatives, antifoams, surfactants, light stabilizers and pH regulators, for example, to the ink of the invention, depending on the field of use.

Examples of suitable pH regulators are inorganic salts such as lithium hydroxide or lithium carbonate, quaternary ammonium hydroxide or ammonium carbonate. Examples of preservatives and antifoams are, for example, sodium dehydroacetate, 2,2-dimethyl-6-acetoxydioxane or ammonium thioglycolate. It is also possible to employ known agents which regulate the viscosity or the surface tension and are described in, for example, U.S. Pat. No. 5,085,698.

Examples of water-miscible organic solvents are aliphatic $C_{1-C4}$alcohols, such as methanol, ethanol, n-propanol, isopropanol, n-butanol, tert-butanol, ketones such as acetone methyl ethyl ketone, methyl isobutyl ketone or diacetone alcohol, and also polyols, Cellosolves and carbitols, such as ethylene glycol, diethylene glycol, triethylene glycol, glycerol, propylene gylcol [sic], ethylene glycol monomethyl or monoethyl ether, propylene glycol methyl ether, dipropylene glycol methyl ether, tripropylene glycol methyl ether, ethylene glycol phenyl ether, propylene glycol phenyl ether, diethylene glycol monomethyl or monoethyl ether, diethylene glycol monobutyl ether, triethylene glycol monomethyl or monoethyl ether, and also N-methyl-2-pyrrolidone, 2-pyrrolidone, N,N'-dimethylformamide or N,N'-dimethylacetamide.

If desired, the ink prepared as described above can be worked up further. The working up of the ink can be carried out by the customary methods for working up dispersions, by separation techniques, such as sieving or centrifuging the coarse particles from the resulting dispersion. It has been found advantageous to carry out centrifuging in two stages of different intensity. First for 10 minutes to 1 hour at from 2000 to 4000 rpm and then for 10 minutes to 1 hour at from 6000 to 10,000 rpm.

Following centrifuging or sieving, the dispersion can be used directly as an ink for inkjet printing, for example.

The present invention therefore also relates to a process for preparing inks by mixing high molecular mass organic material with a coloristically effective amount of the pigment dispersions of the invention or with compound (I) or with the compositions of the invention.

The present invention additionally relates to a process for producing color filters comprising a transparent substrate and applied thereon a red, blue and green layer in any desired sequence, by preparing the red, blue and green layer with in each case one appropriately colored pigment dispersion of the invention or a compound (I) or a composition of the invention comprising pigmented high molecular mass organic material. The different-colored layers preferably have patterns such that over at least 5% of their respective surface they do not overlap and with very particular preference do not overlap at all.

The preparation and use of color filters or color-pigmented high molecular mass organic materials are described in Displays 14/2, 1151 (1993), or Journal of the SID 113, 341–346 (1993) or at the IDW'95 (Paper CF-3, pages 57–60 of the printed version) or Journal of Photopolymer Science and Technology 9/1, 109–120 (1196) and also in Nippon Steel Corp., Application JP 09176511-A, Primary Accession No. 97-399776/37, Pigment dispersion compositions for colour resist inks, Asahi Glass Co. Ltd., Application JP 09132740-A, Primary Accession No. 97-328594/30., Ink for inkjetting and substrate with colour filter, and Fuji Pigment Co. Ltd., EP 784085-A2, Primary Accession No. 97-352867/33, An ink composition for inkjet application and production of coloured filters, and also in Canon KK, Application JP 08327811-A, Primary Accession No. 97-090690/09, where the preparation of color filters and liquid-crystal displays is described.

The color filters can be coated for example using inks, especially printing inks, which comprise the pigment dispersions of the invention or can be prepared for example by mixing a pigment dispersion of the invention with chemically, thermally or photolytically structurable high molecular mass material (resist). The subsequent preparation can be carried out, for example, in analogy to EP-A 654 711 by application to a substrate, such as a LCD, subsequent photostructuring and development.

Particular preference for the production of color filters is given to the pigment dispersions of the invention which possess non-aqueous solvents or dispersion media for polymers.

The invention additionally embraces a transparent substrate coated with one red, one blue and one green layer each of an appropriately colored pigment dispersion of the invention or of a compound (I) or of a composition of the invention comprising pigmented high molecular mass organic material. The sequence of the coating is generally unimportant. Preferably, the different-colored layers have patterns such that over at least 5% of their respective area they do not overlap and, with particular preference, do not overlap at all.

The present invention, furthermore, also embraces color filters comprising a transparent substrate and applied thereon a red, blue and green layer each obtainable from an appropriately colored pigment dispersion of the invention or comprising compound (I) or a composition of the invention.

The present invention relates, moreover, to toners comprising a pigment dispersion of the invention or a compound (I) or a composition of the invention comprising pigmented high molecular mass organic material in a coloristically effective amount.

The present invention additionally relates to processes for preparing toners by mixing a high molecular mass organic material with a coloristically effective amount of the disperse pigment dispersion of the invention or of the compound (I) or a composition of the invention comprising pigmented high molecular mass material.

In a particular embodiment of the process of the invention, toners, coating materials, inks or colored plastics are prepared by processing masterbatches of toners, coating materials, inks or colored plastics in roll mills, mixing apparatus or grinding apparatus.

The present invention additionally relates to colorants comprising a pigment dispersion of the invention or a compound (I) or a composition of the invention comprising pigmented high molecular mass organic material in a coloristically effective amount.

The present invention relates, moreover, to a process for preparing colorants by mixing a high molecular mass organic material and a coloristically effective amount of the disperse pigment dispersion of the invention or of the compound (I) or a composition of the invention comprising pigmented high molecular mass material.

The present invention additionally relates to colored plastics or polymeric ink particles comprising a pigment dispersion of the invention or a compound (I) or a composition of the invention comprising pigmented high molecular mass organic material in a coloristically effective amount.

The present invention relates, moreover, to a process for preparing colored plastics or polymer ink particles by mixing a high molecular mass organic material with a coloristically effective amount of the disperse pigment dispersion of the invention or of the compound (I) or a composition of the invention comprising pigmented high molecular mass material.

The present invention relates, moreover, to non-impact-printing material comprising a pigment dispersion of the invention or a compound (I) or a composition of the invention comprising pigmented high molecular mass organic material in a coloristically effective amount.

The present invention relates, moreover, to a process for preparing non-impact-printing material by mixing a high molecular mass organic material and a coloristically effective amount of the disperse pigment dispersion of the invention or of the compound (I) or a composition of the invention comprising pigmented high molecular mass material.

A coloristically effective amount of the disperse pigment dispersion of the invention or of the compound (I) or a composition of the invention comprising pigmented high molecular mass material denotes in general from 0.0001 to 99.99% by weight, preferably from 0.001 to 50% by weight and, with particular preference, from 0.01 to 50% by weight, based on the overall weight of the material pigmented therewith.

It has now been found that with the process of the invention very fine pigment dispersions are prepared without high energy, time and apparatus requirements as are required in the case of grinding and evaporation techniques. The pigment dispersions are notable for high stability and transparency. The pigmentations obtained with the pigment dispersions of the invention or compound (I) feature high heat stability, color strength, brightness and transparency.

The examples which follow illustrate the invention.

a) Salt kneading of compound (I)

EXAMPLE 1

1 mol of diacetone alcohol is added to 1 mol of compound (I), prepared in accordance with U.S. Pat. No. 3,394,123, and 4 mol of common salt and the mixture is kneaded in a Z-blade kneader at 60° C. for 12 hours. It is then filtered off over a Büchner funnel and the residue is washed with water until all of the salt and solvent is removed. The residue is dried at 80° C.

EXAMPLE 2

1 mol of diacetone alcohol is added to 1 mol of pigment powder, compound (I) prepared in accordance with U.S. Pat. No. 3,394,123, and 4 mol of common salt and the mixture is subsequently kneaded in a Z-blade kneader at 60° C. for 12 hours.

It is then filtered off over a Büchner funnel and the residue is washed with water until all of the salt and solvent is removed.

EXAMPLE 3

1 mol of diethylene glycol is added to 1 mol of pigment powder compound (I), prepared in accordance with U.S. Pat. No. 3,394,123, and 4 mol of common salt and the mixture is subsequently kneaded in a Z-blade kneader at 60° C. for 12 hours.

It is then filtered off over a Büchner funnel and the residue is washed with water until all of the salt and solvent is removed. The residue is dried at 80° C.

b) Preparing concentrates

EXAMPLE 4

39.6 g of the filter cake from Example 2) are admixed with 350 g of a solution of 30% by weight styrene-acrylic resin* (e.g. Joncryl SCX 8082 from the company Johnson) and 19 g of water and also 5 g of isopropanol and the mixture is subsequently ground in a ball mill for 24 hours with glass beads having a diameter of 2 mm. The resulting mixture is sieved and then the desired concentrate is isolated as eluate. Examined visually after 24 hours, the concentrate shows neither flocculation nor sedimentation.

*The styrene-acrylic resin has a viscosity of 11.5 sec at a dilution of 50 g of this solution with 43 g of water and 7 g of isopropanol (Ford Cup No. 4)

EXAMPLE 5

39.6 g of the filter cake from Example 2) are admixed with 350 g of a solution of 30% by weight styrene-acrylic resin* (e.g. Joncryl SCX 8082 from the company Johnson) and 19 g of water and also 5 g of isopropanol and the mixture is then ground in a bead mill for 10 minutes with zirconium oxide beads having a diameter of 1–1.6 mm. The resulting mixture is subsequently sieved and the desired concentrate is isolated as eluate. Examined visually after 24 hours, the concentrate shows neither flocculation nor sedimentation.

c) Preparing a standard ink for inkjet (printing) applications

EXAMPLE 6

22.5 g of a concentrate according to Example 4) are admixed with 6 g of a solution comprising 30% by weight of styrene-acrylic resin* (e.g. Joncryl SCX 8082 from the company Johnson), 6 g of diethylene glycol, 0.2 g of a fluorosurfactant in diethylene glycol, 0.1 g of butyl sulfoxide and 0.1 ml of tributyl phosphate and 40 g of water. This mixture is subsequently mixed for 5 minutes in an Ultraturrax and then centrifuged first for 30 minutes at 3000 rpm and then for 30 minutes at 8000 rpm. The supernatant solution is decantered and inserted as ink into a customary commercial inkjet printer. A test print with this ink is notable for high color strength.

We claim:

1. A pigment dispersion comprising a polymer, and a compound of the formula (I)

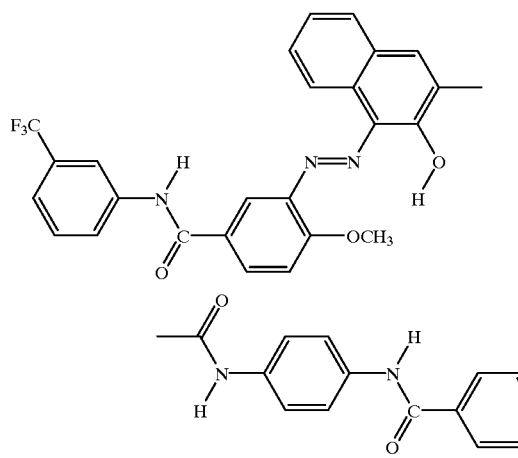

in a colloidal form dispersed in a water-free solvent or a water-containing solvent, said pigment dispersion having an average particle size of less than 0.5 micrometers.

2. Pigment dispersion according to claim 1 comprising a water-containing solvent.

3. Process for preparing a pigment dispersion containing a polymer, and a compound of the formula (I)

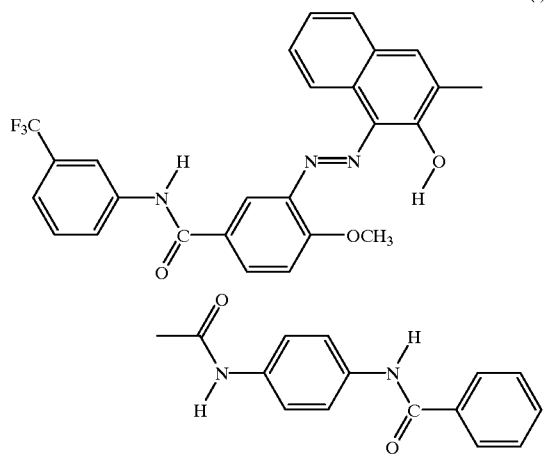

dispersed in a water-free solvent or a water-containing solvent wherein the compound of formula (I), a salt, said water-free solvent or said water-containing solvent and said polymer are mixed with one another to form an initial mixture, said initial mixture is filtered to recover a filter residue, said filter residue is mixed with an additional amount of said water-free or said water-containing solvent to produce a second mixture that is then ground.

4. Process for preparing pigment dispersions containing a polymer, and a compound of the formula (I)

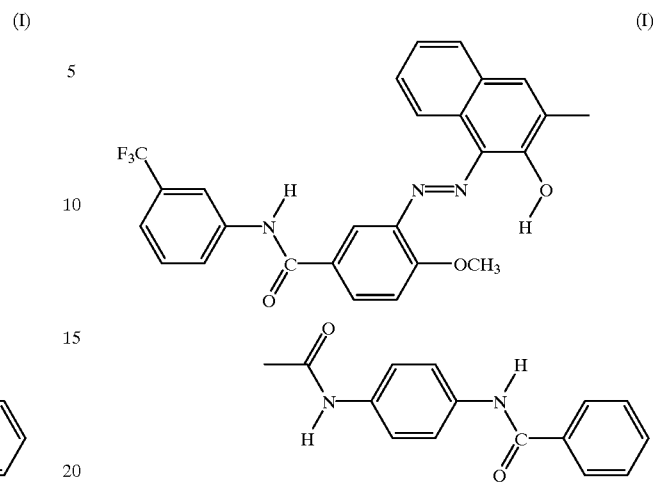

dispersed in a water-free solvent or a water-containing solvent wherein the compound of formula (I), a salt, said water-free solvent or said water-containing solvent, are mixed to form an initial mixture, the initial mixture is then filtered to recover a filter residue, said filter residue is mixed with said polymer in an additional amount of said water-free solvent or said water-containing solvent with polymers and solvent to form a second mixture of said filter residue and said polymer in solvent and the second mixture of said filter residue and said polymer in solvent is ground.

5. A pigment dispersion obtained by the process according to claim 3.

6. Pigment dispersions obtained by the process according to claim 4.

7. Compositions comprising high molecular mass material selected from the group consisting of resins, oils, rubber, casein, viscose, cellulose ethers, cellulose esters, polymers, polyolefins, copolymers and mixtures thereof and a coloristically effective amount of a pigment dispersion comprising a polymer, and a compound of the formula (I)

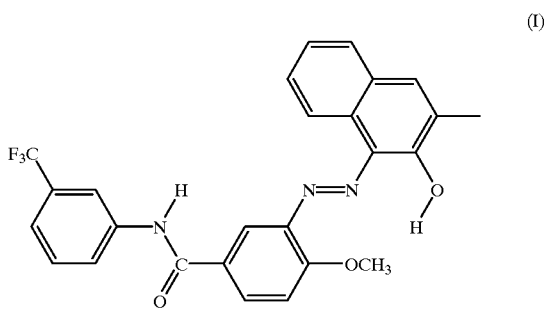

-continued
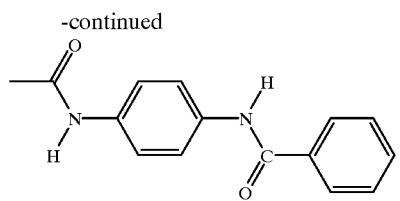
dispersed in
a water-free solvent or
a water-containing solvent.
* * * * *